United States Patent [19]

Gibson, Jr.

[11] Patent Number: 4,806,506

[45] Date of Patent: Feb. 21, 1989

[54] PROCESS FOR DETACKIFYING PHOTOPOLYMER FLEXOGRAPHIC PRINTING PLATES

[75] Inventor: Joseph W. Gibson, Jr., Wilmington, Del.

[73] Assignee: E. I. Du Pont De Nemours and Company, Wilmington, Del.

[21] Appl. No.: 96,694

[22] Filed: Sep. 14, 1987

[51] Int. Cl.$^4$ ................................................. G03F 7/00
[52] U.S. Cl. .................................... 430/309; 430/306; 430/328; 430/286; 101/463.1; 101/467
[58] Field of Search ............................. 101/463.1, 467; 430/286, 271, 306, 309, 328

[56] References Cited

U.S. PATENT DOCUMENTS

| | | | |
|---|---|---|---|
| 3,506,440 | 4/1970 | Sugimoto | 96/36 |
| 3,723,120 | 3/1973 | Hummel | 96/35.1 |
| 4,202,696 | 5/1980 | Takahashi et al. | 430/306 |
| 4,400,459 | 8/1983 | Gruetzmacher et al. | 430/306 |
| 4,400,460 | 8/1983 | Fickes et al. | 430/306 |
| 4,411,983 | 10/1983 | Washizawa et al. | 430/325 |
| 4,725,528 | 2/1988 | Koch et al. | 430/280 |

FOREIGN PATENT DOCUMENTS 0017927 9/1984 European Pat. Off. .
2823300 12/1979 Fed. Rep. of Germany .
542167 4/1977 U.S.S.R. .

*Primary Examiner*—Ellis P. Robinson
*Assistant Examiner*—Donald J. Loney

[57] ABSTRACT

An improved process for detackifying imagewise exposed and solvent-developed photopolymeric flexographic relief printing plates wherein an aprotic organic solvent is applied to the surface of the printing plate prior to irradiation with wavelengths in the 200 to 300 nm range.

10 Claims, No Drawings

PROCESS FOR DETACKIFYING PHOTOPOLYMER FLEXOGRAPHIC PRINTING PLATES

FIELD OF THE INVENTION

This invention relates to photosensitive flexographic elastomeric relief printing plates, and, more particularly, to a process for reducing the tackiness of such plates by exposure to radiation.

BACKGROUND OF THE INVENTION

Reliefs, especially flexographic relief printing plates useful for letterpress printing, can be prepared from photopolymerizable elements comprising (1) a layer of solvent-soluble photosensitive elastomeric composition containing (a) a thermoplastic, elastomeric polymeric binder comprising polymerized conjugated diene monomers, (b) an addition polymerizable, nongaseous, ethylenically unsaturated compound, and (c) an addition polymerization initiator or initiator system activatable by actinic radiation; (2) a permanently affixed support; and, usually, (3) a removable cover sheet.

Such elements and processes for their use in preparing relief printing plates are well known in the art; see, e.g., Plambeck, U.S. Pat. No. 2,760,863; Suzuki et al., U.S. Pat. No. 3,556,791; Varga et al., U.S. Pat. No. 3,798,035; Kurka, U.S. Pat. No. 3,825,430; Recchia et al., U.S. Pat. No. 3,951,657. It is often desirable to interpose a flexible, transparent polymeric film between the cover sheet and the surface of the photosensitive layer to protect the transparency used in imaging the element. The thickness of the photosensitive layer used depends on the thickness desired in the relief image. In general, the thickness of the photopolymerizable layer will vary from about 0.005 to about 0.250 inches or more and layers within this thickness range will be used for the majority of printing plate applications.

In general, the process of preparing a flexographic printing plate from a photopolymer element includes the steps of "backflash", main image exposure, development or "washout", drying, detackification, and post-exposure.

The "backflash" exposure may be used with elements having a transparent support. Backflash generally uses a radiation source emitting a principal wavelength around 360 nm. It serves to sensitize the plate and establishes the depth of the plate relief. The backflash exposure gives the photopolymer film a uniform and relatively short exposure through the support, thereby photocrosslinking binder and monomer in the floor region.

The coversheet is then removed and an image-bearing transparency is placed on the photopolymer surface or, preferably, on a transparent flexible protective polymeric film overlaying the photopolymer layer. The main imagewise exposure also generally utilizes a source emitting strongly at around 360 nm (340 to 400 nm), which photocrosslinks binder and monomer, creating insolublized areas extending from the plate surface to the floor created by the backflash exposure.

After these exposures, the photopolymerizable composition is removed in the unexposed areas by treatment with a suitable solvent which will dissolve the unexposed areas of the layer but not the exposed, polymerized areas. This step is known as development or "washout". Solvent development may be carried out at about 25° C., but best results are sometimes obtained when the solvent is warm, e.g., 30° to 60° C. Development time can be varied, but is preferably in the range of about 5 to 25 minutes. Developer may be applied in any convenient manner, including immersion, spraying, and brush or roller application. Brushing aids in removing the unpolymerized or non-crosslinked portions of the composition. Washout is frequently carried out in an automatic processing unit which uses solvent and mechanical brushing action to remove the unexposed portions of the plate, leaving a relief constituting the exposed image and floor.

Following solvent development, the relief printing plates are generally blotted or wiped dry, and then dried in a forced air or infrared oven. Drying times and temperatures vary, but drying for 60 to 120 minutes at 60° C. (140° F.) is typical. High temperatures are not recommended as shrinkage of the support may cause registration problems. Additional air drying overnight (sixteen hours or more) is common. Solvent will continue to evaporate from the printing relief during drying at ambient conditions.

Even after drying, however, photopolymer flexographic printing plates generally retain at least some degree of surface tackiness, particularly on the "shoulders" of the relief and other non-image areas. This surface tackiness is undesirable in a printing relief. Not only is it difficult to handle a tacky printing relief, but such plates have a tendency to stick together when temporarily stacked for storage. Moreover, tacky plates pick up ordinary dust and dirt, as well as paper dusts when used for printing on paper. It is common practice, therefore, to employ one of several currently known detackification or "finishing" measures. For example, it is well known in the art that chemical treatment with either dilute aqueous chlorine or bromine, or exposure to short wavelength irradiation, can reduce this surface tackiness. All of these measures, however, have various limitations or shortcomings.

In addition to "finishing" to remove surface tackiness, most flexographic printing plates are uniformly post-exposed to ensure that the photocrosslinking process is complete and that the plate will remain stable during printing and storage. This "post-exposure" utilizes the same ultraviolet radiation source as the main exposure (usually wavelengths of 300 to 420 nm). Post-exposure is used to complete polymerization and maximize plate hardness and durability, but does not remove tackiness. Accordingly, both detackification and post-exposure procedures are routinely carried out.

A variety of detackification processes utilize some form of chlorine or bromine. See, e.g., U.S. Pat. No. 4,400,460 and German Patent, DE No. 2 823 300. U.S. Pat. No. 4,400,459 to Gruetzmacher et al. teaches a process for detackifying photosensitive elastomeric flexographic printing plates, wherein the developed, dried surface is, in either order, (1) post-exposed to actinic radiation, and (2) treated with a solution of an alkali monopersulfate and a bromide salt.

U.S.S.R. Pat. No. 542 167, Inventors: Shur et al., teaches a method of producing photopolymer printing plates, wherein after development, the printing plate is reexposed under a layer of protective fluid, thereby eliminating tackiness. Fluids which do not react with or damage the polymerized material may be used, including water. When using radiation sources that produce short wavelength UV-radiation (less than 250 nm), solutions of mineral salts ($KNO_3CuSO_4$, etc.) as well as dyes may be used as the protective fluid to separate the actinic zones from other zones of the radiation.

U.S. Pat. No. 4,202,696 to Takahashi et al. teaches a method of removing surface tack from photopolymer printing plates by impregnating the surface layer with an organic carbonyl compound capable of abstracting a hydrogen atom and then irradiating the plate with actinic radiation having wavelengths of 200 to 300 nm to excite the organic carbonyl compound. Significant amounts of this wavelength radiation can be obtained from germicidal lamps, high pressure mercury lamps, low pressure mercury lamps, and heavy hydrogen lamps.

U.S. Pat. No. 3,506,440 to Sugimoto teaches a method of reinforcing exposed and developed photosensitive coatings containing principally polyvinyl cinnamate by post-exposing to ultraviolet radiation having a wavelength range of 2200 to 3400 Angstroms (220 to 340 nm). A sterilizing lamp which produces a strong spectrum of light of 2537 A. wavelength is said to be particularly preferred.

European Published Patent Application No. 0 017 927 to Nakamura et al. teaches a process for detackification of photosensitive elastomeric printing plates by exposing to light having a wavelength not longer than 300 nm, e.g., with "germicidal" lamps. While the described process provides an effective and convenient means of detackifying a photopolymer printing plate which has been developed or "washed out" with an organic solvent or mixture of solvents, e.g., perchloroethylene/n-butanol or trichloroethylene, it has been found that this process does not provide satisfactory detackification of a photopolymer plate which has been developed in an aqueous or semiaqueous solution. It has been found, moreover, that some residual aprotic organic solvent must be present for satisfactory detackification to occur, i.e., overdrying of photopolymer relief plates developed in solutions such as perchloroethylene/n-butanol results in unpredictable and unsatisfactory detackification with short wavelength radiation such as that emitted by "germicidal lamps".

Accordingly, the present invention relates to an improved method of detackifying photopolymer printing reliefs which have been processed in an aqueous or semiaqueous developer. It also provides a method whereby organic solvent-processed photopolymer printing reliefs can be detackified with greater predictability and uniformity using germicidal radiation, and whereby such a method can be used with overdried organic solvent-processed printing reliefs.

BRIEF SUMMARY OF THE INVENTION

The invention relates to a process for detackifying an imagewise exposed and solvent-developed photopolymeric flexographic relief printing plate prepared from a photosensitive elastomeric composition containing an ethylenically unsaturated photopolymerizable monomer or oligomer having at least one terminal ethylenically unsaturated group; a photoinitiator or photoinitiator system; and a solvent-soluble elastomeric binder comprising polymerized conjugated diene monomers; comprising the steps of:
(a) drying the plate after development,
(b) exposing the printing surface to radiation with wavelengths in the range of 200 to 300 nm, and,
(c) subsequently, simultaneously, and/or prior to exposure step (b) exposing the printing surface to actinic radiation having a wavelength longer than 300 nm, the improvement comprising:
applying an aprotic organic solvent to the surface of the plate after step (a) and before step (b) above.

DETAILED DESCRIPTION OF THE INVENTION

There are a great variety of photopolymerizable compositions suitable for use in flexographic printing plates. These compositions may in general be categorized as either organic solvent soluble or water soluble. The organic solvent-soluble compositions are soluble only in organic solvents or solvent systems, whereas the aqueous or semiaqueous-processable compositions may be developed in aqueous, semiaqueous or organic solvents.

Photopolymerizable layers of the type taught in Plambeck, U.S. Pat. No. 2,760,863; Chen and Brennan, U.S. Pat. No. 4,323,636; Toda et al., U.S. Pat. No. 4,045,231; Heinz et al., U.S. Pat. No. 4,320,188; are prepared from polymeric components which are soluble only in organic solvents. For example, U.S. Pat. No. 4,323,636 to Chen and Brennan teaches a photosensitive composition containing a solvent-soluble, thermoplastic elastomeric block copolymer having at least two thermoplastic, nonelastomeric polymer blocks having a glass transition temperature above 25° C., and between said thermoplastic, nonelastomeric blocks, an elastomeric polymer block having a glass transition temperature below 10° C. Other photopolymerizable compositions containing elastomeric block copolymers useful for preparing flexographic relief printing plates are taught in U.S. Pat. Nos. 4,430,417, and 4,045,231. Suitable developer solvents for these compositions include aromatic hydrocarbon and aliphatic halohydrocarbon solvents, for example, perchloroethylene, 1,1,1-trichloroethane, tetrachloroethane, trichloroethylene, benzene, toluene, xylene, hexane, methylisobutylketone or mixtures of such solvents with lower alcohols. A 75/25 (v/v) mixture of perchloroethylene and n-butanol is frequently used commercially for this type of photopolymerizable composition. The n-butanol component of this mixture does not washout the photopolymerizable composition, but is included because it dissolves the flexible polymeric release layer that serves to protect the transparency during imagewise exposure.

Photopolymer printing reliefs processed in these organic solvents may be efficiently and conveniently detackified by exposure to germicidal radiation, i.e., emitting wavelengths in the 200–300 nm range, so long as usual drying procedures are followed, e.g., 60 minutes in a 60° C. oven. If these plates are dried for long periods or stored prior to germicidal exposure, however, they behave at best unpredictably, and at worst, fail to exhibit satisfactory detackification.

Efforts to avoid the high cost, flammability, and environmental hazards associated with organic solvents have led to the development of a number of photopolymerizable compositions which are soluble in water or aqueous alkali solutions, or mixtures of water and organic solvents which are substantially aqueous. Aqueous or semiaqueous solubility is frequently conferred by introducing carboxyl groups into the polymeric binder component of the photosensitive composition. Carboxyl groups may be incorporated into the high molecular weight polymer by addition to the polymerization process of a carboxyl containing monomer, e.g., acrylic or methacrylic acid or a monomer which is convertible to a carboxyl containing group, e.g., maleic anhydride or methyl methacrylate.

Alles, U.S. Pat. No. 3,458,311, teaches a number of photopolymer compositions developable in aqueous or semiaqueous media, i.e., water is the main constituent of the developer. Other references which teach photopolymer compositions developable in water or aqueous or semiaqueous alkali include Pohl, U.S. Pat. No. 4,442,302; Pine, U.S. Pat. No. 4,361,640; Kai et al., U.S. Pat. No. 3,794,494; Proskow, U.S. Pat. Nos. 4,177,074 and 4,431,723; and Worns, U.S. Pat. No. 4,517,279.

Preferred aqueous developers usually also contain a water miscible organic solvent and an alkaline material. Suitable water miscible organic solvents include isopropanol, butanol, diacetone alcohol, 1-methoxyethanol, 2-ethoxyethanol, and 2-n-butoxyethanol. Suitable alkaline materials include alkali metal hydroxides. A preferred developer is a water/isopropanol solution (90/10 v/v) containing 0.1–0.3% by weight sodium hydroxide. The semiaqueous developer utilized in the Examples of the present application was water/butyl carbitol (83/17 v/v) with 0.44% sodium hydroxide. Other aqueous developer combinations which may be employed are described in U.S. Pat. No. 3,796,602. Photopolymer printing reliefs processed in such aqueous or semiaqueous solvents are not adequately detackified by exposure to radiation sources emitting wavelengths in the 200–300 nm range unless an aprotic organic solvent is first applied to the plate.

As discussed earlier, preparation of a photopolymer relief printing plate usually involves several exposures: the "backflash", the main imagewise exposure, and the overall "post-exposure". The primary purpose of each of these exposures is to effect polymerization, and actinic radiation from a variety of sources can be used, including commercial ultraviolet fluorescent tubes, medium, high and low pressure mercury vapor lamps, argon glow lamps, electronic flash units, photographic flood lamps, pulsed xenon lamps, carbon arc lamps, etc. The radiation source must emit an effective amount of radiation having a wavelength in the range of 230 to 450 nm, preferably 300 to 420 nm, and more preferably, 340 to 400 nm. For efficient photopolymerization, the wavelength is matched to the absorption characteristics of the photoinitiator present in the photopolymerizable layer. A standard radiation source is the Sylvania 350 Blacklight fluorescent lamp (FR 48T12/350 VL/VHO/180, 115 w), which emits actinic radiation having a central wavelength around 354 nm. Exposure times vary from a few seconds to a few minutes, depending on the output of the lamps, distance from the lamps, relief depth desired, and the thickness of the plate.

The radiation used for detackification of the exposed and developed photopolymer printing reliefs according to the invention should have wavelengths in the 200 to 300 nm range. Germicidal lamps having a central wavelength of about 254 nm are a preferred light source. Wavelengths below 200 nm should be avoided since they tend to produce ozone, which causes cracking and other deleterious effects on photopolymer printing plates. As discussed earlier, "post-exposure" with the usual sources of polymerizing radiation such as the Sylvania 350 Blacklight bulbs which emit actinic radiation with a central wavelength around 354 nm, does not eliminate tackiness. In fact, it is reported in European Published Patent Application No. 0 017 927 that post-exposure with these wavelengths sometimes causes increased stickiness due to the production of tacky decomposition products.

The invention relates to a process for detackifying an imagewise exposed and solvent-developed photopolymeric flexographic relief printing plate prepared from a photosensitive elastomeric composition containing an ethylenically unsaturated photopolymerizable monomer or oligomer having at least one terminal ethylenically unsaturated group; a photoinitiator or photoinitiator system; and a solvent-soluble elastomeric binder comprising polymerized conjugated diene monomers; comprising the steps of:
(a) drying the plate after development,
(b) exposing the printing surface to radiation with wavelengths in the range of 200 to 300 nm, and,
(c) subsequently, simultaneously, and/or prior to exposure step (b), exposing the printing surface to actinic radiation having a wavelength longer than 300 nm, the improvement comprising: applying an aprotic organic solvent to the surface of the plate, after step (a) and before step (b) above.

The invention provides an improved method for detackifying a developed and dried photopolymer flexographic relief printing plate, comprising applying to said plate an organic solvent which is perchloroethylene, 1,1,1-trichloroethane, hexane, toluene, N-methylpyrrolidone, or other aprotic organic solvent, or mixtures thereof, and exposing to radiation having a wavelength in the range of 200 to 300 nm. Protic solvents such as ethanol, propanol, butanol, butyl carbitol, etc., do not function in similar fashion. While it is not known with certainty, it is believed that the function of the organic solvent is to solvate the photopolymerized structure of the plate to facilitate light finishing.

Perchloroethylene and 1,1,1-trichloroethane are preferred organic solvents within the invention. Also preferred as a matter of convenience is the 3:1 perchloroethylene:n-butanol developer solution commonly used to wash out organic solvent-developable photopolymer flexographic printing plates. Although the n-butanol component of this solution is a protic organic solvent and does not facilitate light finishing, the presence of such a protic solvent does not interfere with the action of the aprotic organic solvent. Accordingly, it is contemplated that various organic solvent mixtures can be used in the present invention so long as the mixtures contain a substantial amount of an aprotic organic solvent.

EXAMPLES

The following examples serve to illustrate the practice of the present invention, of which Example 1 serves as a Best Mode.

EXAMPLE 1

A photopolymerizable element, comprising a sheet of a semiaqueous-developable photosensitive elastomeric composition containing an acrylonitrile/butadiene/acrylic acid copolymer binder; a polyethylene terephthalate support; and a polyamide coated polyethylene terephthalate cover sheet, was prepared substantially as described in Example 8 of U.S. Pat. No. 4,415,649. The element was exposed to actinic radiation through the support for 5 minutes at an intensity of 7 mW/cm$^2$, using U.V. fluorescent lamps (Du Pont Photoproducts Exposure Lamp, Part No. 276208-001, Wilmington, DE) having a central wavelength of about 368 nm, to form a uniform, polymerized floor. The polyester cover sheet was then removed and the unexposed top surface was exposed through an image-bearing film negative for 11 minutes using the same UV fluorescent lamps to form a hardened polymerized image. Unhardened areas were washed out by brushing the surface with a heated (60° C.) semiaqueous solvent (17% butyl carbitol, 0.44% sodium hydroxide). The plate was then dried at 60° C. for 60 minutes. The image and non-image surfaces were tacky. The surface of the plate was then rinsed with a 3:1 solution of perchloroethylene:n-butanol and blotted with a non-woven spun-laced towel. The plate was then exposed to a radiation source consisting of 9 40 W germicidal lamps (central wavelength of 254 nm) for 8 minutes at an intensity of 4 mW/cm$^2$ and at a distance of 3.0 inches (7.6 cm). After this treatment, the semiaqueous-developed platehad no tacky surfaces. The plate was further post-exposed for 10 minutes using the same U.V. fluorescent lamps that were used to form the plate floor and image. The plate remained non-tacky.

Comparison A

A photopolymerizable element as described in Example 1 was exposed, developed in semiaqueous solvent, and dried at 60° C. for 60 minutes, following the procedure of Example 1, except that no aprotic organic solvent was applied after drying and before exposure to the germicidal lamps. The plate remained tacky and was unacceptable for printing. The plate remained tacky even when the exposure with germicidal lamps was increased to 35 minutes.

Comparison B

A photopolymerizable element as described in Example 1 was exposed, developed in semiaqueous solvent, and dried at 60° C. for 60 minutes, following the procedure of Example 1, except that n-propanol was applied after drying and before exposure to the germicidal lamps. The plate remained tacky and was unacceptable for printing. The plate remained tacky even when the exposure with germicidal lamps was increased to 35 minutes.

The foregoing procedure was repeated with another photopolymerizable element of the same composition, except that n-butanol was applied prior to germicidal irradiation. Again, no detackification was observed.

EXAMPLE 2

A photopolymerizable element, comprising a sheet of organic solvent-developable photopolymeric elastomeric composition containing a styrene-isoprene-styrene block copolymer binder; a polyethylene terephthalate support; and a polyamide coated polyester cover sheet, was prepared substantially as described in Example XXXVI of U.S. Pat. No. 4,323,637. The element was backside and imagewise exposed to UV light as in Example 1. The unhardened areas were washed out by brushing the surface with a mixture of 3:1 perchloroethylene:n-butanol. The printing plate obtained was dried at 60° C. for 60 minutes, then allowed to cool and sit overnight (16 hours) resulting in the loss of additional organic solvent from the printing plate. The image and non-image surfaces remained tacky. The surface of the plate was then rinsed with the washout solvent (3:1 perchloroethylene:n-butanol) and blotted with a non-woven spun-laced towel. The plate was then exposed to the same germicidal lamps as in Example 1 for 7 minutes. After this treatment, the plate had no tacky surfaces. The plate was further post-exposed to UV light as in Example 1 for 10 minutes. The plate remained non-tacky.

When used for flexographic printing, the plate thus produced provided excellent, consistent printability, and did not cause problems associated with surface tackiness.

In like manner, a flexographic relief printing plate comprising a layer of photopolymeric, elastomeric composition contining a styrene-butadiene-styrene block copolymer binder, substantially as described in Example 1 of U.S. Pat. No. 4,323,637, can be prepared, treated with an aprotic organic solvent, and "finished" by exposure to germicidal radiation.

Comparison C

A photopolymer element as described in Example 2 was exposed, developed in 3:1 perchloroethylene:n-butanol, and dried as in Example 2, but no aprotic organic solvent was applied before exposing the plate to germicidal wavelength radiation (254 nm) for 7 minutes. The printing plate remained tacky following germicidal exposure and could not be used for printing.

Comparison D

A photopolymer element as described in Example 2 was backside and imagewise exposed, and developed in 3:1 perchloroethylene:n-butanol, as in Example 2. However, the plate was dried at 60° C. for a long period (16 hours) to remove virtually all solvent from the plate, and then exposed to the same germicidal lamps as in Example 1 for 60 minutes. The plate was unacceptable for printing as tackiness was not removed from the plate surface and cracks had formed on the plate surface.

Comparison E

A photopolymerizable element as described in Example 2 was exposed and developed as in Example 2, and then dried at 60° C. for at least 6 hours to remove virtually all developer. The dried plate was rinsed with n-propanol, blotted dry, and exposed to germicidal radiation for 7 minutes as in Example 2. The plate remained tacky and was unacceptable for printing. The plate remained tacky even when germicidal exposure was increased to 30 minutes.

The foregoing procedure was repeated with another photopolymerizable element of the same composition except that n-butanol was applied prior to germicidal irradiation. Again, no detackification was observed.

EXAMPLE 3

As in Example 2, a photopolymerizable element, comprising a sheet of organic solvent-developable photopolymeric elastomeric composition containing a styrene-isoprene-styrene block copolymer binder; a polyethylene terephthalate support; and a polyamide coated polyester cover sheet, was prepared substantially as described in Example XXXVI of U.S. Pat. No. 4,323,637. The element was backside and imagewise exposed to UV light as in Example 1. The unhardened areas were then washed out by brushing the surface with a mixture of 3:1 perchloroethylene:n-butanol for 5 minutes. The printing plate obtained was dried at 60° C. for 60 minutes. On cooling to room temperature, the image and non-image surfaces remained tacky. The plate was then exposed to germicidal radiation for 20 minutes at an intensity of 4 mW/cm$^2$ and a distance of 3.0 inches (7.6 cm) from the radiation source, which consisted of 9 40 W germicidal lamps (central wavelength of 254 nm). After this treatment, the plate had no tacky surfaces. The plate was further post-exposed to UV light for 10 minutes, using the same lamps used for the backside and imagewise exposures. The plate remained non-tacky. Additional plates were prepared in the same manner except for the following variations in the drying times and the times required for detackification:

| Drying Time (60° C.) Minutes | Detackification Time Minutes |
|---|---|
| 10 | 6 |
| 60 | 20 |
| 120 | 30 |

As drying time increased, the concentration of residual aprotic organic solvent (e.g., perchloroethylene) in the plate decreased. This necessitated longer exposure times to germicidal wavelengths to remove plate tackiness.

EXAMPLE 4

An aqueous-developable photosensitive element, as described in Example 1, was given backside and imagewise exposures with UV light, developed with a semiaqueous solution (17% butyl carbitol, 0.44% sodium hydroxide), and dried at 60° C. for 60 minutes as in Example 1. Both image and non-image surfaces were tacky. The surface of the tacky plate was then sprayed with an aerosol dispersion of fluorocarbon polymer and organic binder resins in 1,1,1-trichloroethane (63%), isopropyl alcohol (1%), 1,1,2-trichloro-1,2,2-trifluoroethane (5%), with dichlorodifluoromethane propellant (30%), (Detac®, manufactured by Anderson and Vreeland, Bryan, Ohio). The plate had no tacky surfaces. The plate was then exposed to the same germicidal lamps as in Example 1 for 4 minutes. the plate was wiped with n-propyl alcohol and remained non-tacky. The plate was further post-exposed to UV light for 10 minutes as in Example 1 and the non-tackiness remained.

EXAMPLE 5

A photopolymer element as described in Example 2 was backside and imagewise exposed, and developed in 3:1 perchloroethylene:n-butanol as in Example 2. The plate was then dried at 60° C. for 60 minutes. The image and non-image surfaces of the plate were tacky. The surface of the plate was then sprayed with a halogenated aprotic organic solvent (1,1,1-trichloroethane), and exposed to the same germicidal lamps as in Example 1 for 12 minutes. After this treatment, the plate had no tacky surfaces. The plate was further post-exposed to UV light as in Example 1 for 10 minutes. The plate remained non-tacky.

EXAMPLE 6

A photopolymerizable element, comprising a layer of an organic solvent-developable photosensitive elastomeric composition containing a styrene-butadiene-styrene block copolymer binder, an ethylenically unsaturated monomer, and a photoinitiator system; a polyethylene terephthalate support; and a polyamide coated polyester cover sheet, was prepared substantially as taught by U.S. Pat. No. 4,323,637. After exposure and development with 3:1 perchloroethylene:n-butanol as described in Example 2, the plate was dried at 60° C. for 30 minutes. The plate surface was tacky. The surface of the plate was then sprayed with an aerosol dispersion of fluorocarbon polymer and organic binder resins in 1,1,1-trichloroethane (63%), isopropyl alcohol (1%), 1,1,2-trichloro-1,2,2-trifluoroethane (5%), with a dichlorodifluoromethane propellant (30%), (Detac®, manufactured by Anderson and Vreeland, Bryan, Ohio) and allowed to air dry. The plate had no tacky surfaces. The plate was exposed to the same germicidal lamps as in Example 1 for 2 minutes. The plate was wiped with isopropyl alcohol and the non-tackiness remained.

Comparison F

A photopolymerizable element as in Example 6 was subjected to irradiation, washing out of unhardened areas with 3:1 perchloroethylene:n-butanol, drying at 60° C. for 30 minutes, and sprayed with the same fluorocarbon polymer and organic binder aerosol composition, as in Example 6. However, exposure with germicidal lamps was omitted. After aerosol application of the composition the plate became non-tacky. After being wiped with isopropyl alcohol, however, the surface of the plate again became tacky.

Comparison G

A photopolymerizable element as in Example 6 was subjected to irradiation, washing out of unhardened areas with 3:1 Aperchloroethylene:n-butanol, and drying at 60° C. for 30 minutes as in Example 6. The tacky plate was exposed to germicidal lamps for 2 minutes as in Example 6, but in contrast to the plate sprayed with the aerosol composition containing aprotic organic solvent, the tackiness was not removed.

EXAMPLE 7

A photopolymerizable element, comprising a sheet of organic solvent-developable photopolymeric elastomeric composition containing a styrene-isoprene-styrene block copolymer binder; a polyethylene terephthalate support; and a polyamide coated polyester cover sheet, was prepared substantially as described in Example XXXVI of U.S. Pat. No. 4,323,637. The element was backside exposed for 2 minutes and imagewise exposed for 15 minutes to UV light, following the procedures of Example 1. The unhardened areas were then washed out by brushing the surface with 100% hexane for 8 minutes. The plate was dried at 60° C. for 30 minutes. The plate was then exposed to the same germicidal wavelength irradiation described in Example 1 for 8 minutes. After this treatment, the plate had no tacky surfaces. The plate was further post-exposed to UV fluorescent lamps having a central wavelength of 365 nm. The plate remained non-tacky.

This illustrates that nonhalogenated aprotic organic solvents can be used to facilitate detackification with germicidal wavelength radiation. Other non-halogenated aprotic solvents which can be used in the invention include toluene and n-methyl-2-pyrrolidone.

EXAMPLE 8

Sheets of commercially available photosensitive elastomeric compositions were processed by the steps of backside and imagewise irradiation, and washing out of unhardened areas as in Examples 1 and 2. After processing, the sheets were dried for 60 minutes at 60° C., and light finished for the indicated times in a commercially available light finishing apparatus (35×47 unit, manufactured by Rebo Denshi Co., Japan; 254 nm germicidal bulbs, type GL40W). Table 1 contains comparative results which show that the present invention is applicable to commercially available plates which are either aqueous or solvent developable. The times in minutes in the table are the germicidal lamp exposure used to detackify or the maximum exposure given, i.e., the aqueous developed Du Pont Cyrel ® 107LP plate not rinsed with perchloroethylene/n-butanol remained tacky after germicidal lamp exposure for 60 minutes.

TABLE 1

| FLEXOGRAPHIC PLATE | LIGHT FINISH TIME - MINUTES | |
|---|---|---|
|  | DRY 1 HOUR 60° C. RINSE* AND BLOT | DRY 1 HOUR 60° |
| DU PONT CYREL ® 107 HL | 7 | 20 |
| DU PONT CYREL ® 107 HOS | 4.5 | 7 |
| DU PONT CYREL ® 107 LP (Solvent developed) | 8 | 34 |
| DU PONT CYREL ® 107 LP (Aqueous developed) | 8 | >60 (still tacky) |
| ASAHI 100 AFP | 4 | 10 |
| BASF 67 FA | 6 | 35 |
| UNIROYAL FLEXLIGHT 112 KOR | 4 | 12 |

*RINSE: 75/25 PERCHLOROETHYLENE/N—BUTANOL AND BLOTTED WITH A NON-WOVEN SPUN-LACED TOWEL.

I claim:

1. In a process for detackifying an imagewise exposed and solvent-developed photopolymeric flexographic relief printing plate prepared from a photosensitive elastomeric composition containing an ethylenically unsaturated photopolymerizable monomer or oligomer having at least one terminal ethylenically unsaturated group; a photoinitiator or photoinitiator system; and a solvent-soluble elastomeric binder comprising polymerized conjugated diene monomers; comprising the steps of:
   (a) drying the plate after development,
   (b) exposing the printing surface to radiation from a source emitting wavelengths in the range of 200 to 300 nm, and,
   (c) subsequently, simultaneously, or prior to exposure step (b) exposing the printing surface to actinic radiation from a different source having a wavelength longer than 300 nm,
   the improvement comprising:
      applying an aprotic organic solvent to the surface of the plate, after step (a) and before step (b) above.

2. A process according to claim 1, wherein said aprotic organic solvent is perchloroethylene, 1,1,1-trichloroethane, hexane, toluene, or N-methylpyrrolidone.

3. A process according to claim 1, wherein the flexographic printing plate is developed with an aqueous or semiaqueous developer solution.

4. A process according to claim 2, wherein the flexographic printing plate is developed with an aqueous or semiaqueous developer solution.

5. A process according to claim 2, wherein said aprotic organic solvent is 1,1,1-trichloroethane.

6. A process according to claim 5, wherein the flexographic printing plate is developed with an aqueous or semiaqueous developer solution.

7. A process according to claim 5, wherein the 1,1,1-trichloroethane is sprayed onto the printing surface.

8. A process according to claim 2, wherein said aprotic organic solvent is perchloroethylene.

9. A process according to claim 1, wherein the plate is blotted after application of the aprotic organic solvent.

10. A process according to claim 2, wherein the plate is blotted after application of the aprotic organic solvent.

* * * * *